(12) United States Patent
Russell et al.

(10) Patent No.: US 6,271,078 B1
(45) Date of Patent: Aug. 7, 2001

(54) SIMPLIFYING CONDUCTIVE PLATE/VIA ISOLATION

(75) Inventors: Stephen W. Russell; Antonio L. P. Rotondaro; Donald L. Plumton, all of Dallas; Duane E. Carter, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/324,949

(22) Filed: Jun. 3, 1999

Related U.S. Application Data
(60) Provisional application No. 60/090,155, filed on Jun. 22, 1998.

(51) Int. Cl.[7] .................................................. H01L 21/302
(52) U.S. Cl. .......................... 438/241; 438/253; 438/254; 438/255; 438/700; 438/734; 438/739; 134/1.2
(58) Field of Search .................................... 438/241, 253, 438/254, 255, 700, 696, 720, 734, 739, 743, 723; 134/1.2

(56) References Cited

FOREIGN PATENT DOCUMENTS 04-134856 * 5/1992 (JP) .

* cited by examiner

*Primary Examiner*—Gregory Mills
*Assistant Examiner*—George Goudreau
(74) *Attorney, Agent, or Firm*—Jacqueline J. Garner; W. James Brady, III; Frederick J. Telecky, Jr.

(57) ABSTRACT

A dry etch using CFx in an O2-rich environment will clean the contact/via at the same time it retracts a layer of TiN enclosed in the dielectric layer, such as the plate layer in a Capacitor-Under-Bitline DRAM cell.

11 Claims, 3 Drawing Sheets

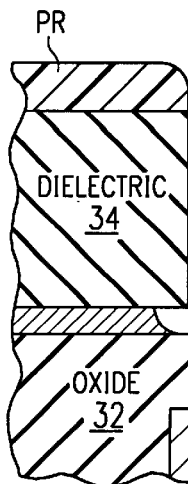
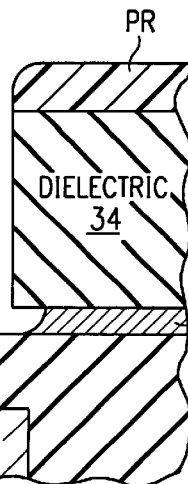
FIG. 3A  FIG. 3B
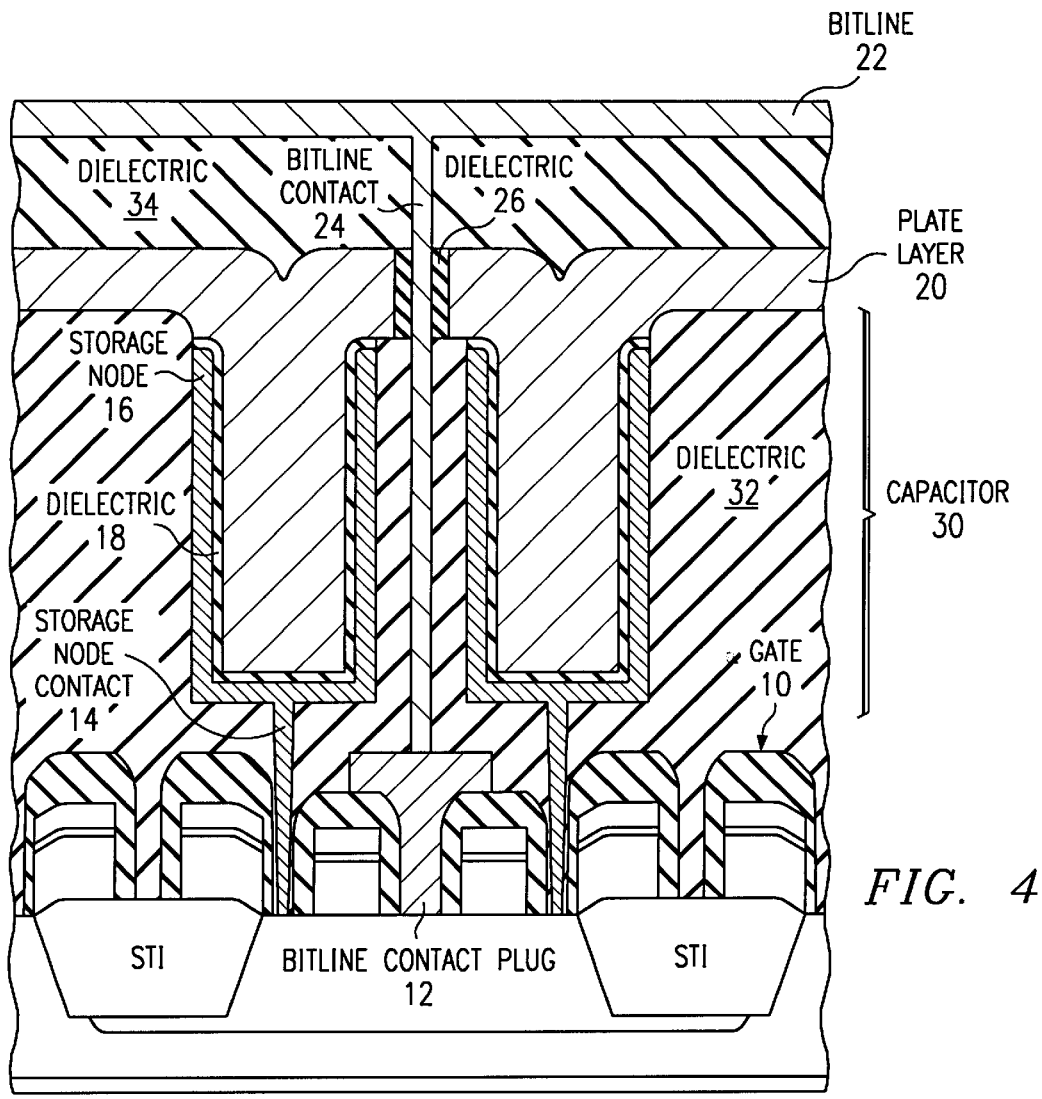
FIG. 4

SIMPLIFYING CONDUCTIVE PLATE/VIA ISOLATION

This application claims priority under 35 USC §119(e)(1) of provisional application no. 60/090,155 filed Jun. 22,1998.

BACKGROUND AND SUMMARY OF THE INVENTION

The present invention relates to integrated circuit structures and fabrication methods, especially to the fabrication of DRAM Arrays.

Background: Capacitor-Under-Bitline DRAM

DRAM cells have a capacitor buried under, or stacked over, the transistor associated with it. Where the capacitor is stacked over the transistor, there are two types of cells: the Capacitor Over Bitline (COB) cell and the Capacitor Under Bitline (CUB). FIG. 4 shows an example of a CUB DRAM architecture, with capacitor structures 30, composed of the conductive storage node layer 16, dielectric layer 18, and plate layer 20, rising above the gates 10 of the transistors in the DRAM array. The use of polysilicon to form the conductive plate layer is changing to the use of metals, such as TiN, to avoid depletion layer formation in the capacitor, which in turns lowers cell capacitance. Bitline 22 runs above the capacitors, with the bitline contact 24 descending through the top capacitor electrode (plate) 20 to contact underlying devices or risers, such as the bitline contact plug 12. As the bitline contact is etched through the conductive plate layer of the capacitor, shorting to this plate by the via must be avoided at all costs, or the DRAM will lose functionality due to inadvertent capacitor leak-age/discharge. Current state-of-art technology utilizes the following flow:

a.) Etch via through the capacitor plate;
b.) Ash and post-etch clean (in no particular order);
c.) Wet etch to isotropically remove that portion of the plate which is immediately adjacent to the via, with e.g. H2O2- or HF-containing aqueous solutions;
d.) conformal deposition and etchback of dielectric 26, generally SiN or SiO2, which insulates the via/plate junction (or partial oxidation of the plate layer if it is still polysilicon).

Simplifying Plate/Via Isolation in CUB DRAM

The present application discloses using a dry (plasma) process to accomplish both the post-etch clean and wet etch steps. Previous work has shown that the use of dilute CFx, in O2-rich remote plasmas will isotropically etch TiN from the top of Al metallizations. Using this process to remove post-etch residue from the via replaces expensive and environmentally-unfriendly solvent cleans, while simultaneously retracting the capacitor plate material from the via sidewalls.

Advantages of the disclosed methods and structures include simplification of the fabrication process, which in turn reduces costs.

BRIEF DESCRIPTION OF THE DRAWINGS

The disclosed inventions will be described with reference to the accompanying drawings, which show important sample embodiments of the invention and which are incorporated in the specification hereof by reference, wherein:

FIGS. 3A–B shows a cross-section of a partially fabricated integrated circuit structure at various points during an alternate embodiment of the disclosed process.

FIG. 4 shows a cross-section of one type of CUB DRAM array which can be fabricated using the disclosed process.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Embodiment: One Step Contact Etch

Figure 1A:
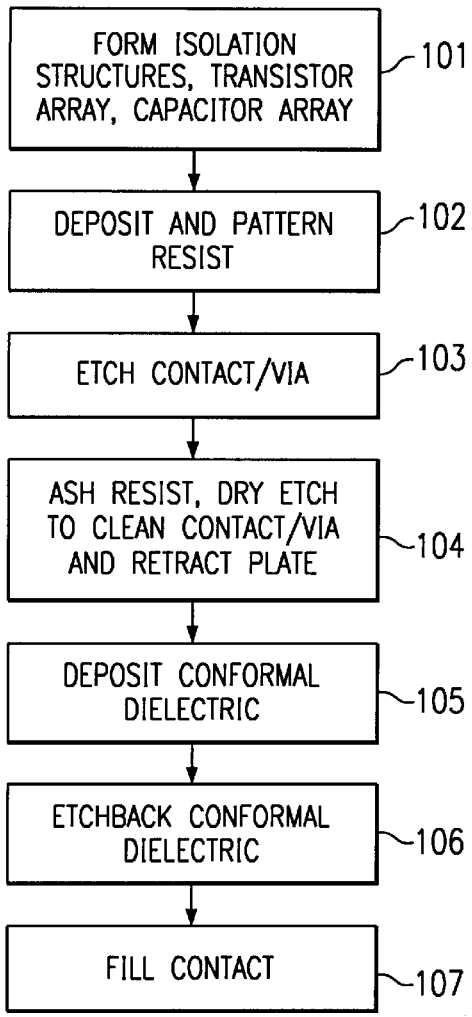
FIGS. 1A–C are flow charts showing key steps in various embodiments of the disclosed process for retracting the plate layer from around a contact.

FIG. 1A shows a first embodiment of the process, and will now be discussed. Prior to the disclosed process for isolating the via from the plate layer, the DRAM array will be formed. Only a general discussion of this process will be given here, as there are many methods by which this array can be formed.

Isolation structures, such as the STI isolation of FIG. 3 are formed, followed by the formation of the DRAM transistors. A dielectric layer is deposited and bitline and storage node contacts are formed. Capacitors 30 are formed, having plate layer 20, which is an extension of one node of the capacitors (step 101). In this embodiment, the plate layer consists of approximately 100 nm of TiN. The capacitors are surrounded by dielectric layer 32 and overlain by a further dielectric layer 34, both generally an oxide.

Figure 2A:
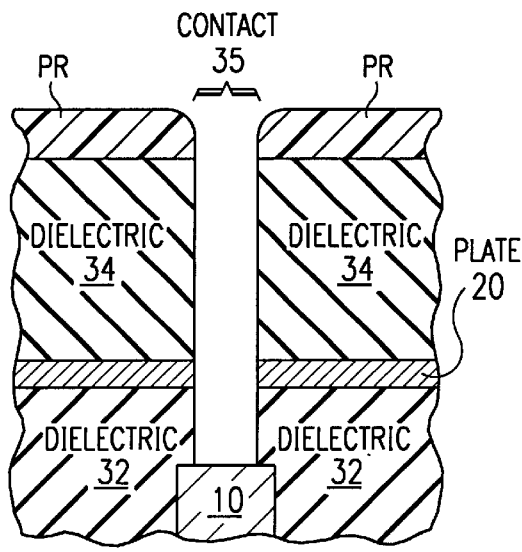
FIGS. 2A–C shows a cross-section of a partially fabricated integrated circuit structure at various points during one embodiment of the disclosed process.

FIG. 2A shows a simplified view of the bitline contact as it descends through the plate layer. Resist PR has been deposited and patterned (step 102). This is followed by the etch (step 103) of the contact 35, which passes through the unpatterned conductive plate layer 25. Immediately after the contact etch, the resist is ashed. A further dry etch (step 104), to etch back or retract the TiN plate layer, is performed with the following parameters:

| | |
|---|---|
| Source gas (O$_2$) | 4,000 sccm |
| Source gas (C$_2$F$_6$) | 6 sccm |
| Pressure | 1.5 Torr |
| RF power | 850 W |

Figure 2B:
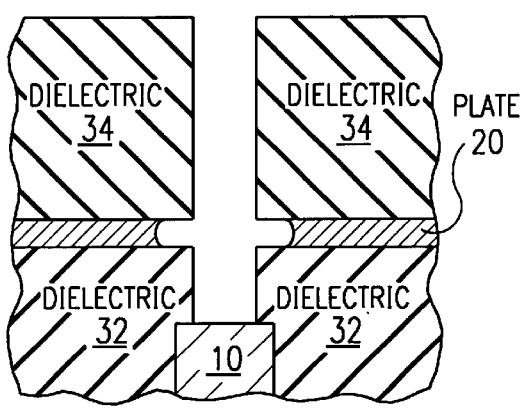

This etchback accomplishes two purposes: at the same time that it etches back the TiN layer, removing generally 100 nm of TiN to form a void between the TiN and the contact, it removes residue left in the contact when it was formed. FIG. 2B shows the contact at this stage of the process.

Figure 2C:
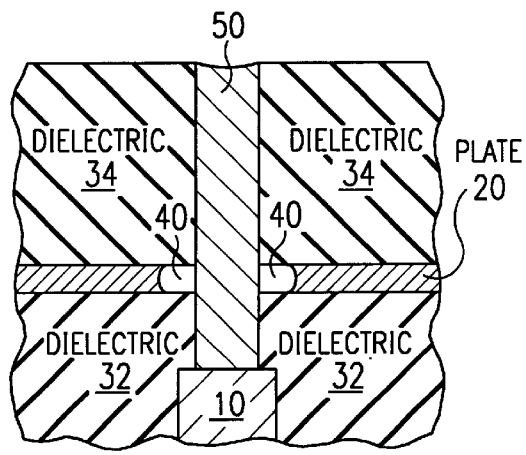

After this etch is performed, it is followed by deposition (step 105) of a conformal SiN, which is then non-isotropically etched (step 106) to leave the dielectric 40 only in the void formed by the isotropic etch. Finally, the contact will be filled (step 107) with a conductive layer 50, e.g. polysilicon, giving the structure seen in FIG. 2C.

Alternate Embodiment: Two Step Contact Etch

Figure 1B:
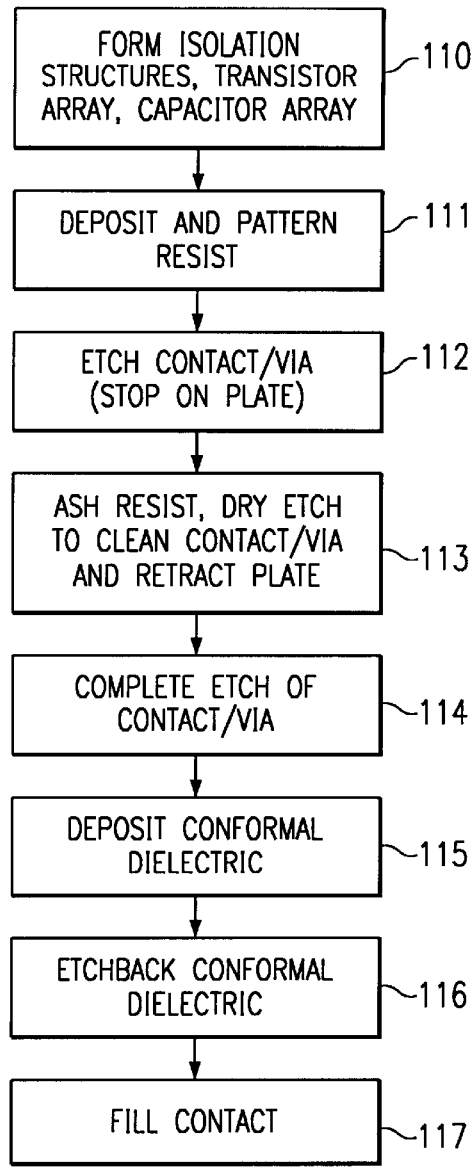

FIG. 1B shows an alternate embodiment, with a two-step etch of the contact. After formation of the capacitors (step 110) and deposition and patterning of the photo-resist (step 111), the etch of the contact (step 112) stops on the plate 20. The resist is ashed and the dry etch of the previous embodiment is performed (step 113), both etching through and retracting the plate, as well as cleaning the contact. The completion of this step is shown in FIG. 3A. Etch of the contact is then completed (step 114), followed by deposition (step 115) and etchback (step 116) of the conformal dielectric. Finally, the contact is filled (step 117), giving the structure shown in FIG. 3B.

Figure 1C:
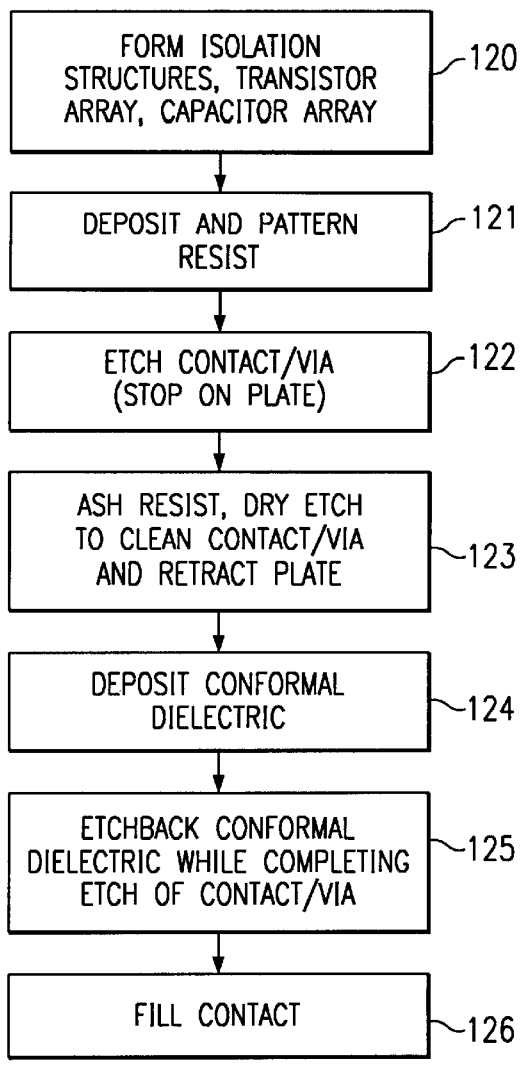

Alternate Embodiment: Second Step of Contact Etch Simultaneous with Conformal Dielectric Etch In a further alternate embodiment, shown in FIG. 1C, after formation of the capacitors (step 120) and patterning of the resist (step 121), the contact etch again stops on the plate (step 122). The resist is ashed, followed by a dry etch to etch through and retract the plate (123). Instead of immediately continuing the contact etch, conformal dielectric 40 is deposited (step 124) to fill the void created by the retraction step. Finally, the etch of the contact is completed (step 125), which also removes excess portions of dielectric layer 40, followed by filling of the contact (step 126).

Alternate Embodiment: Dry Etch Before Resist Ash

In any of the preceding embodiments, the dry etch with $CF_x/O_2$ can be performed prior to the stripping of the resist. Additionally, the etch process may be performed in either the same chamber as the ashing process or in a separate chamber.

Alternate Embodiment: Alternate Plate Materials

In addition to TiN, other conductive materials (e.g., WN, TiAlN, TiSiN, or WSiN) can be used to form the plate layer so long as the process is optimized to achieve desired amount of plate retraction.

Alternate Embodiment: Composite Structure for Plate

In an alternate embodiment, a composite structure is used for the plate, e.g. a titanium/TiN structure. The layers must have similar etch rates to prevent partial retraction.

Alternate Embodiment: Alternate Etch Chemistries

In an alternative embodiment, $O_2/SF_6$ is used as the etch chemistry for plate retraction. Other process parameters remain the same.

According to a disclosed class of innovative embodiments, there is provided: A fabrication method, comprising the steps of: (a.) etching an opening into a layer of dielectric containing a conductive structure; (b.) performing a dry etch which isotropically removes portions of said conductive structure which are adjacent said opening.

According to another disclosed class of innovative embodiments, there is provided: A fabrication method, comprising the steps of: (a.) forming an array of capacitors and covering said array of capacitors with a first dielectric; (b.) forming an opening through said first dielectric and through a portion of one of said capacitors, to contact a conductive structure underlying said one of said capacitors; (c.) performing a dry etch which isotropically etches portions of said one of said capacitors to produce a void adjacent to said opening.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the disclosed method is not only applicable to the pit- or cup-type DRAM cells as shown in FIG. 3, but are also applicable to crown cells or other cell structures which use the capacitor-under-bitline structure.

What is claimed is:

1. A fabrication method, comprising the steps of:

(a.) etching an opening into a layer of dielectric containing a conductive structure;

(b.) performing a dry etch which isotropically removes portions of said conductive structure which are adjacent said opening, wherein said step of performing a dry etch cleans residue produced by said step of etching an opening from said opening.

2. The method of claim 1, further comprising the step of (c.) depositing a second dielectric into at least a portion of the space where said conductive structure was removed.

3. The method of claim 1, wherein said step (a.) is performed in multiple steps.

4. A fabrication method, comprising the steps of:

(a.) forming an array of capacitors and covering said array of capacitors with a first dielectric;

(b.) forming an opening through said first dielectric and through a portion of one of said capacitors, to contact a conductive structure underlying said one of said capacitors;

(c.) performing a dry etch which isotropically etches portions of said one of said capacitors to produce a void adjacent to said opening; wherein said dry etch cleans said opening, of materials produced by said step of forming an opening.

5. The method of claim 4, further comprising the step of (d.) filling said void with a second dielectric.

6. The method of claim 4, wherein said array of capacitors overlies a corresponding array of transistors.

7. The method of claim 4, wherein said step (b.) is performed in multiple steps.

8. The method of claim 1, wherein said step of performing a dry etch comprises a gas chemistry comprising $O_2$ and $CF_x$.

9. The method of claim 1, wherein said step of performing a dry etch comprises a gas chemistry comprising $O_2$ and $SF_6$.

10. The method of claim 4, wherein said step of performing a dry etch comprises a gas chemistry comprising $O_2$ and $CF_x$.

11. The method of claim 4, wherein said step of performing a dry etch comprises a gas chemistry comprising $O_2$ and $SF_6$.

* * * * *